United States Patent
Marienborg et al.

(10) Patent No.: US 9,735,802 B1
(45) Date of Patent: Aug. 15, 2017

(54) OVERLOAD DETECTION AND CORRECTION IN DELTA-SIGMA ANALOG-TO-DIGITAL CONVERSION

(71) Applicant: Texas Instruments Incorporated, Dallas, TX (US)

(72) Inventors: Jan-Tore Marienborg, Oslo (NO); Tobias Edström, Oslo (NO)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/367,667

(22) Filed: Dec. 2, 2016

(51) Int. Cl.
| | |
|---|---|
| H03M 1/06 | (2006.01) |
| H03M 3/00 | (2006.01) |
| H03M 1/12 | (2006.01) |
| H03M 1/10 | (2006.01) |

(52) U.S. Cl.
CPC ......... *H03M 3/422* (2013.01); *H03M 1/0617* (2013.01); *H03M 1/1009* (2013.01); *H03M 1/1245* (2013.01); *H03M 3/458* (2013.01)

(58) Field of Classification Search
CPC .... H03M 3/422; H03M 3/458; H03M 1/0617; H03M 1/1245; H03M 1/06; H03M 1/1023; H03M 1/203; H03M 1/207; H03M 1/12
USPC ......................................... 341/118, 155, 143
See application file for complete search history.

(56) References Cited

U.S. PATENT DOCUMENTS

| | | | | |
|---|---|---|---|---|
| 6,961,015 | B2 * | 11/2005 | Kernahan | H02M 3/157 341/155 |
| 8,618,967 | B2 * | 12/2013 | Nikaeen | H03M 3/458 327/141 |

OTHER PUBLICATIONS

Kyoungtae Lee, et al., "A 1.8mW 2MHz-BW 66.5dB-SNDR ΔΣ ADC Using VCO-Based Integrators with Intrinsic CLA", IEEE, Copyright 2013, 4 pgs.

* cited by examiner

*Primary Examiner* — Jean B Jeanglaude
(74) *Attorney, Agent, or Firm* — Ronald O. Neerings; Charles A. Brill; Frank D. Cimino

(57) ABSTRACT

A voltage-controlled oscillator-based delta-sigma analog-to-digital converter (VCO-based ΔΣ ADC) includes a VCO-based quantizer that includes delay elements to provide VCO outputs based on an analog input signal and combining logic to combine the VCO outputs so as to provide quantized outputs. Detection logic detects saturation of the VCO-based quantizer based on the quantized outputs and at least a portion of the VCO outputs. The VCO-based ΔΣ ADC also includes correction logic to modify the quantized outputs and provide modified quantized outputs in response to the detection logic detecting the saturation of the VCO-based quantizer and to provide the quantized outputs unmodified in the absence of saturation being detected.

20 Claims, 13 Drawing Sheets

OVERLOAD DETECTION AND CORRECTION IN DELTA-SIGMA ANALOG-TO-DIGITAL CONVERSION

TECHNICAL FIELD

This disclosure relates to electronic circuits for conversion between analog signals and digital signals. More particularly, this disclosure relates to overload detection and correction in delta-sigma analog-to-digital conversion.

BACKGROUND

An analog-to-digital converter (ADC) converts an analog signal into a digital signal. For example, ADCs integrate, or sample, analog signals at a sampling frequency and quantization in a multi-level quantizer to achieve corresponding digital signals. This process introduces quantization noise.

ADCs can employ delta-sigma (ΔΣ) modulation to provide dynamic ranges beyond what is possible with other ADC architectures. As one example, a ΔΣ ADC samples an input signal at a rate higher than the Nyquist frequency using an oversampling modulator, which is followed by a digital/decimation filter. Together, the oversampling modulator and the digital/decimation filter produce a high-resolution datastream output.

SUMMARY

In an example, a voltage-controlled oscillator-based delta-sigma analog-to-digital converter (VCO-based ΔΣ ADC) can include a VCO-based quantizer to provide, based on an analog input signal, VCO outputs and quantized outputs. The quantizer includes delay elements to provide the VCO outputs and combining logic to combine the VCO outputs so as to provide the quantized outputs. The ADC further includes detection logic to detect saturation of the VCO-based quantizer based on the quantized outputs and at least a portion of the VCO outputs. The ADC also includes correction logic to modify the quantized outputs and provide modified quantized outputs in response to the detection logic detecting the saturation of the VCO-based quantizer and to provide the unmodified quantized outputs in the absence of saturation being detected.

In another example, a method for converting an analog signal to a corresponding digital signal includes detecting, based on quantized outputs and at least a portion of VCO outputs of a VCO-based quantizer, VCO wrapping in the VCO-based quantizer. The quantized outputs are generated by combining the VCO outputs. The method includes modifying the quantized outputs to enforce a constant minimum or maximum output in response to detecting the saturation of the VCO-based quantizer.

In yet another example, an analog-to-digital converter (ADC) includes a quantizer comprising at least two ring oscillators arranged in a pseudo-differential manner, each ring oscillator comprising a plurality of delay elements. The quantizer includes high and low saturation states characterized by phase differences between the two oscillators. The ADC also includes an array of XOR gates, each XOR gate in the array to provide an output based on inputs from a corresponding delay element in each ring oscillator. A feedback loop includes a digital-to-analog converter (DAC). The ADC also includes saturation correction logic arranged between the XOR gates and the DAC to enforce a constant maximum output signal or a constant minimum output signal for high and low saturation states, respectively, in response to detecting VCO wrapping between the at least two ring oscillators in the quantizer.

DETAILED DESCRIPTION

This disclosure describes analog-to-digital conversion including detection and correction of saturation of a VCO-based quantizer, such as implemented in a delta-sigma analog-to-digital converter. The VCO-based quantizer can include a plurality of ring oscillators, each ring oscillator including a series of delay elements arranged to provide respective VCO outputs. Combining logic combines the VCO outputs to provide quantized outputs for the VCO-based quantizer. Detection logic detects saturation of the VCO-based quantizer based on the quantized outputs and at least a portion of the VCO outputs. For example, the detection logic can include a transition detector to determine which delay element in one of the ring oscillators is in transition and to provide an output from the combining logic corresponding to the determined delay element in transition, a high-element counter to determine a proportion of outputs of the combining logic, and a saturation detector to detect whether the VCO-based quantizer is in a high or low saturation state based on signals from the transition detector and the high-element counter.

The ADC can also include correction logic to modify the quantized outputs and provide modified quantized outputs in response to the detection logic detecting the saturation of the VCO-based quantizer and to provide the quantized outputs unmodified in the absence of saturation being detected. For example, the correction logic can modify the quantized outputs to enforce a constant maximum output based on the determining that the VCO-based quantizer is high saturated, or modify the quantized outputs to enforce a constant minimum output based on the determining that the VCO-based quantizer is low saturated.

The described conversion can resolve erratic converter behavior during input overload due to VCO wrapping. Converter circuitry can include a transition detector, a high-element counter, and a saturation detector to detect when saturation occurs, to detect if output should be maximal or minimal in an overload situation, and to override the output with the correct value whenever the converter is saturated. The described converters and methods promote architectural simplicity and economy, scalability, linearity, low noise operation, low power consumption, enhanced usefulness in radio receivers, and permit architectural modifications, including extension to higher-order architectures.

Figure 1:
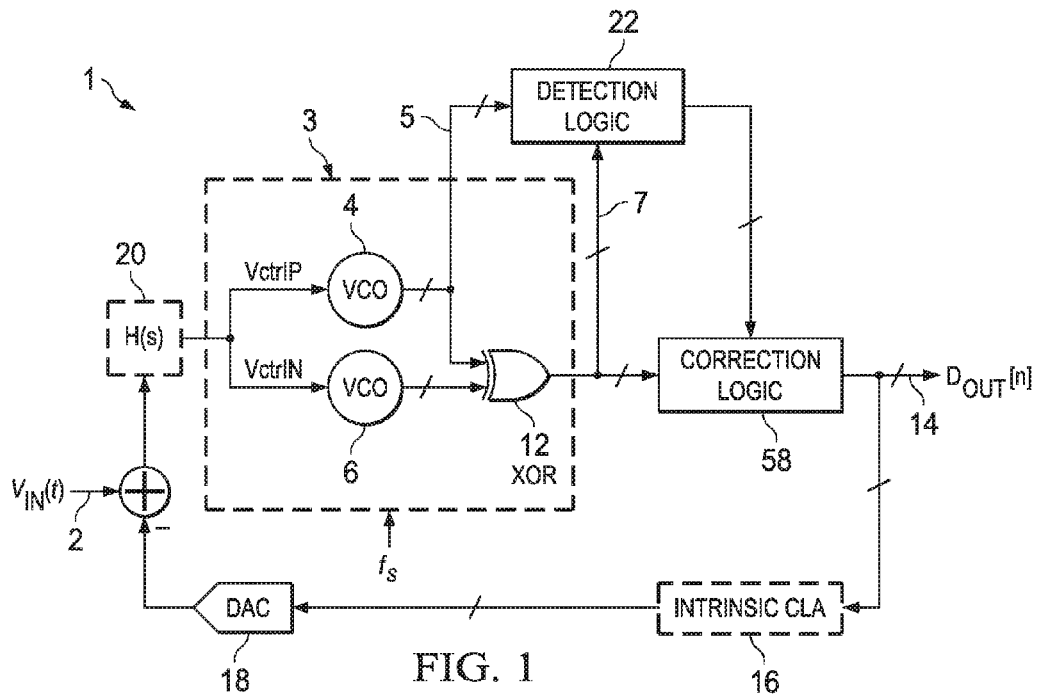
FIG. 1 shows an example of a VCO-based ΔΣ ADC.

FIG. 1 shows an example delta-sigma analog-to-digital converter (ΔΣ ADC) 1. A time-varying analog input signal $V_{IN}(t)$ 2 can be quantized by voltage-controlled oscillator-based (VCO-based) quantizer 3 that can include one or more voltage-controlled oscillators (VCOs) 4, 6 to provide VCO outputs 5, and associated combining logic 12 to provide quantized outputs 7. Combining logic 12 can consist of, for example, an array of XOR gates, but is not limited to such an implementation, and can consist of any circuitry that meaningfully combines the outputs of multiple VCOs. ADC 1 can provide a digital output signal 14 converted from analog input signal 2.

VCO-based quantizer 3 can include any number of VCOs. For example, VCO-based quantizer 3 can include two RO-VCOs 4, 6 that can operate in a pseudo-differential manner. In such a pseudo-differential manner, the RO-VCOs are circuits that have independent topologies and can function entirely independently but are used or arranged in such a way as to function as if operating differentially, such as on complimentary components of a differential input signal $V_{IN}(t)$ 2.

VCOs 4, 6 can be electronic oscillators, the oscillation frequencies of which are controlled by their respective input voltages VctrlP and VctrlN. The signals to control the oscillation frequencies of the VCOs 4, 6 can be generated by the analog input signal 2 and a negative feedback signal output by multi-bit digital-to-analog converter (DAC) 18. The applied input voltage to each VCO can determine the instantaneous oscillation frequency of the VCO. In some examples, VCOs 4, 6 can be ring-oscillator VCOs (RO-VCOs) that include a number of delay elements—the number being, for example, an odd integer three or greater—arranged in a feedback loop to provide an oscillation at a frequency of $1/(2n\tau)$, where n is the number of delay elements in the loop and τ is the delay attributed to each element. The VCOs can be termed "positive" VCO (PVCO) 4 and "negative" (NVCO) 6. The input $V_{IN}(t)$ 2 can provide the supply rail of each delay element to tune the state changes of each inverter according to a input clock signal (not shown).

The VCOs 4, 6 can be arranged to function both as an integrator, performing an amplitude-to-time domain conversion, and as a time-based quantizer. The oscillation produced by the dual-VCO architecture 1 can generate an intrinsic clocked averaging (CLA) process 16, reducing any performance limitation caused by element mismatch in DAC 18. When so arranged, ADC 1 does not require any analog filter H(s) 20, external dynamic element matching (DEM), or calibration. ADC 1 therefore can be made up of only VCOs 4, 6, combining logic 12, and DAC elements 18, promoting simplicity and scalability. Although not illustrated in FIG. 1, ADC 1 might also include circuitry to isolate from kickback noise and/or to provide sampling of VCO outputs 5 and/or quantized outputs 7 at sample rate $f_s$, which is greater than the input clock frequency of the delay elements (e.g., two-times or greater).

ADC 1 can further include detection logic 22 and correction logic 58 to detect and correct overload conditions of the VCO-based quantizer, such as saturation. The logic 22 and 58 thus can mitigate the effects of harmonics generated by ADC 1 and thereby improve overall performance of ADC 1. Absent detection logic 22 and correction logic 58, the output of ADC 1 consists of quantized outputs 7, and ADC 1 can exhibit overload (e.g., saturation) conditions that can result in alternating positive and negative DAC feedback. For example, without logics 22 and 58, overloading of the first-order version of ADC 1 can distort the converted input signal, since part of it will be inverted (typically doubling the frequency of a sine-wave), and can severely distort the noise-shaping of the ADC 1. Higher-order versions of ADC 1 lacking logics 22 and 58 may require reset mechanisms that can be trigged when instability is detected, as the likelihood of overload conditions increase with more aggressive noise-shaping. However, repeated triggering of any such reset mechanisms would make the output discontinuous.

By way of example, the detection and correction logic 22 and 58 can be implemented in the ADC 1 to (1) detect that the VCO-based quantizer of ADC 1 has entered saturation; (2) determine if the VCO-based quantizer has entered a high saturation state, wherein the VCOs exhibit a phase difference larger than the number of inverting delay elements in each VCO ring, or a low saturation state, as indicated by a negative phase difference (i.e., where the phase of the PVCO 4 falls behind the phase of the NVCO 6); and (3) bypass the quantizer output 7 to generate a constant maximum output signal (e.g., of all ones) or a constant minimum output signal (e.g., of all zeros) for high and low saturation states, respectively. Eventually, this can force the dual-VCO-based quantizer to exit saturation.

Figure 2:
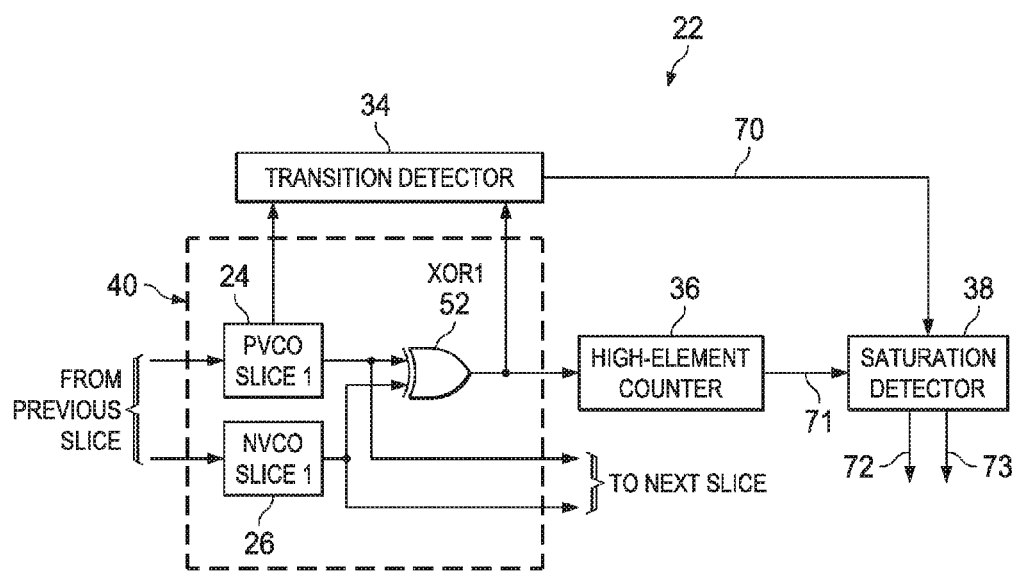
FIG. 2 shows another example VCO-based ΔΣ ADC.

For example, detection logic 22, as shown in FIG. 2, can be provided to ADC 1 to detect an overload condition so that the quantizer output can be overridden during overload. Detection logic 22 can help to enforce meaningful feedback until the overload condition is resolved, and requires no additional reset circuitry, even with higher-order architectures. Detection logic 22 can include a transition detector 34, a high-element counter 36, and a saturation detector 38. The outputs 72, 73 of the saturation detector 38 can assist in determining whether to override the output (i.e., whether ADC 1 is saturated) and what value the output should be overridden with. FIG. 2 illustrates the logic 22 as operating with respect to each individual "slice" 40 of the dual-VCO quantizer, each slice 40 consisting of one delay element 24, 26 from each of the two VCOs 4, 6 and a corresponding combining logic sub-unit 52 connecting the delay elements 24, 26. Combining logic sub-unit 52 can be, for example, an XOR gate, as illustrated in FIG. 2, but is not so limited, and can be any circuitry that meaningfully combines the outputs of slices from different VCOs to provide corresponding quantized outputs.

The functioning and advantages of the logics 22 and 58 may be understood in terms of the functioning of ADC 1 when it lacks logics 22 and 58, as set forth in the following discussion.

Figure 3:
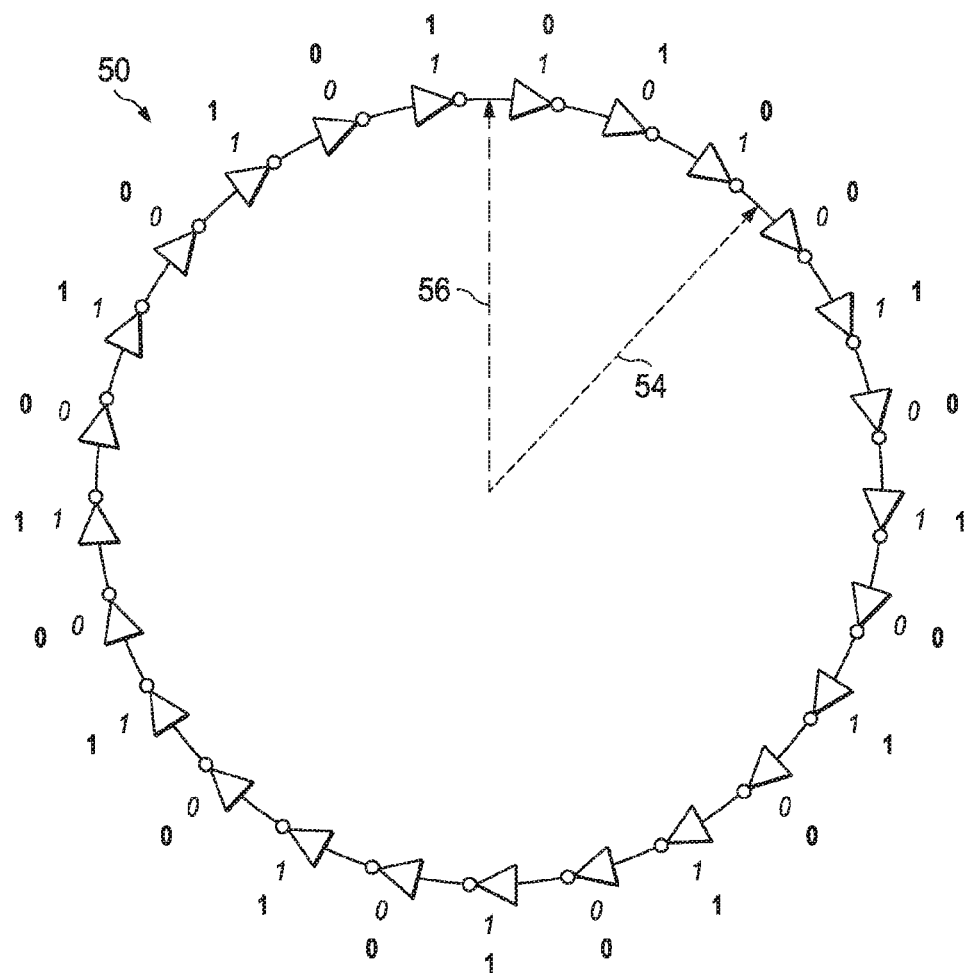
FIG. 3 illustrates quantizer operation and phase difference between the two VCOs in the ADC of FIG. 1.

FIG. 3 illustrates the operation of an example VCO-based quantizer and the phase difference between the two VCOs 4, 6 that make up the example VCO-based quantizer. Each VCO 4, 6 can include a ring 50 of a number of inverting delay elements, each having an input and an output, with some time delay between a change on the input and a corresponding change on the output, the change thus propagating along the ring 50 and cycling around the ring 50. The rings of VCOs 4, 6 have the same number of elements, and the rings can each have any number of elements, for example, an odd number three or greater. Although in some examples VCOs 4, 6 can have different numbers of elements, with one or more elements in one VCO corresponding to a different number of elements in the other VCO to form a slice, in the illustrated examples, for the sake of simplicity, the VCOs 4, 6 have the same number of elements. In the illustrated example in FIG. 3, the oscillation rings in VCOs 4, 6 have twenty-five elements each, and hence there are twenty-five slices in the illustrated example ring 50.

In FIG. 3, twenty-five bits (i.e., zeroes and ones) are shown around the periphery of the ring 50, corresponding to the logical states (i.e., the logical "low" or "high" outputs) of the various inverting delay elements in the ring 50. The bits on the inner periphery illustrate the logical states of the elements of PVCO 4 while the bits on the outer periphery illustrate the logical states of the elements of NVCO 6. In each ring, a transition propagates around the ring in a clockwise direction, which transition is defined as falling between two delay elements that presently have the same logical state.

Two pointers 54, 56 correspond to the element currently in transition for each of the two VCOs 4, 6. Pointer 54, falling between two elements both in a state of logical "low" (two zeroes) depicts the transition of the PVCO 4, while pointer 56, falling between two elements both in a state of logical "high" (two ones), depicts the transition the NVCO 6. The phase difference between the two VCOs 4, 6 can be defined as the number of elements between the two transition pointers 56, 54 and may also be expressed in terms of radians or degrees when the delay elements are visualized as arranged equidistantly along the circle, recognizing that the precision with which such expression may be used is related to the number of elements in ring 50.

Figure 4:
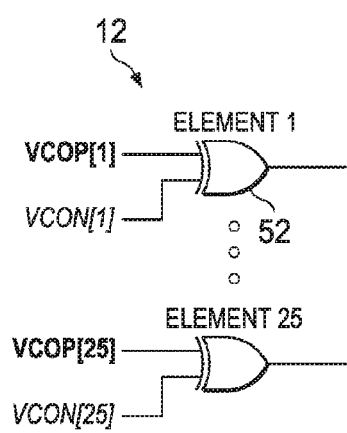
FIG. 4 shows example combining logic of the ADC of FIG. 1 and its inputs.

The phase difference between the two VCOs can be measured by connecting the outputs from corresponding delay element in each VCO 4, 6 to a sub-unit 52 in combining logic 12, which can be, for example, an XOR gate 52 in an array 12 of such gates, as illustrated in FIG. 4. Thus, for example, where each VCO 4, 6 has a ring 50 of twenty-five inverting delay elements, an array 12 of twenty-five XOR gates can have as inputs the corresponding outputs from delay elements in each ring, as shown. Each XOR gate in the array 12 can take as one input the output of a single inverting element in the ring of PVCO 4 and can take as the other input the output of a corresponding inverting element in the ring of NVCO 6. Collectively, the outputs 7 of the combining logic (e.g., XOR gate array) 12 can form a thermometer-coded quantizer operating between zero and the number of delay elements in each ring 50 (twenty-five in the illustrated instance). Thus, in the illustrated example, a quantizer output 7 of zero ones indicates no phase difference between VCOs 4, 6 while an output 7 of twenty-five ones indicates that the VCOs 4, 6 are completely out of phase with each other, i.e., that one of the VCOs is a full rotation ($2\pi$ radians) ahead of the other.

The number of "high" elements in the combining logic 12 can thus be indicative of the phase difference between the two VCOs 4, 6. The quantizer 3 can thereby convert the analog input signal 2 to a corresponding phase difference between the two VCOs 4, 6. A large-amplitude input signal 2 can result in a large phase difference between the VCOs 4, 6, which in turn can result in a large number of sub-units of the combining logic (e.g., a large number of XOR gates in XOR array) 12 with a "high" output. Each of the outputs of the combining logic 12 can be connected to a corresponding element in the current-steering multi-bit DAC 18. In this way, each "high" combining logic output can generate a contribution to the feedback signal which can control the VCO frequencies.

An increased-amplitude input signal 2 can generate a phase difference between the two VCOs 4, 6. If the amplitude of input signal 2 is too high, the quantizer 3 may enter a high saturated mode. This high saturation condition can be visualized graphically as PVCO pointer 54 in FIG. 3 extending more than $2\pi$ radians ahead of NVCO pointer 56. This saturation will cause the quantized output 7 to decrease even though the expected output (62 in FIG. 5) is still the maximum value of the quantizer 3. A low saturation may also occur when the PVCO pointer 54 decreases below NVCO pointer 56, causing the output to start to increase (64 in FIG. 5), even though the quantizer 3 should be expected to deliver a constant minimum output (66 in FIG. 5). Whichever of the two forms it takes, the root cause of either quantizer saturation condition can be termed "VCO wrapping."

Figure 5:
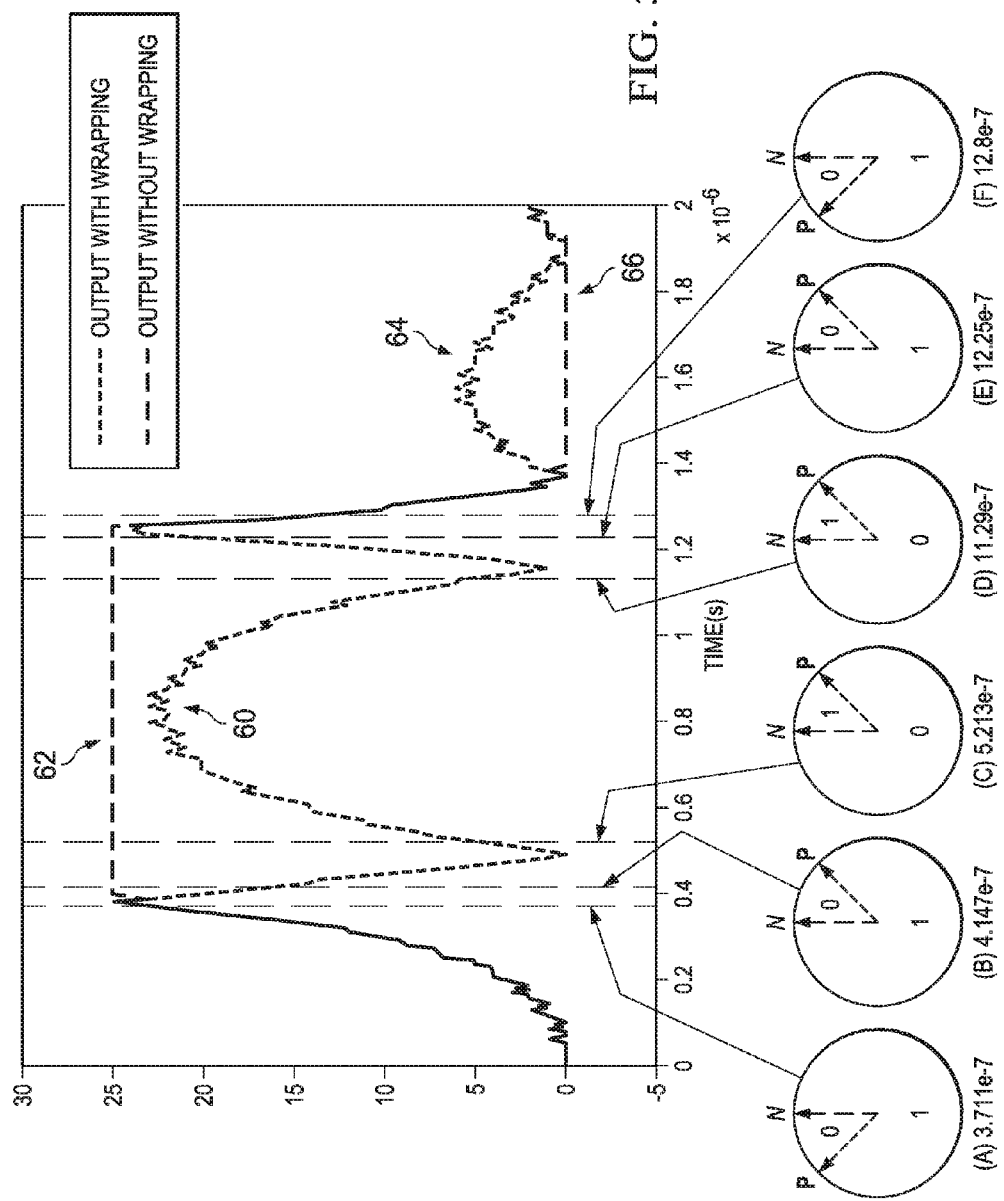
FIG. 5 is a plot showing an example quantizer output under different saturation conditions and quantizer phase diagrams of corresponding quantizer transition states.

Both of the above-described saturation issues are illustrated in FIG. 5, which shows a plot of ADC output with respect to time as quantizer 3 undergoes both a high saturation condition 60 and a low saturation condition 64 in sequence. Both the expected behavior 62, 66 of ADC 1, i.e., the behavior when ADC 1 includes logics 22, 58, ("output without wrapping") and the actual behavior 60, 64 of ADC 1 when ADC 1 lacks logics 22, 58 ("output with wrapping") are shown. The transition vector diagrams under the graph indicate the VCO element transitions 54, 56.

At time (a) in FIG. 5, at around the 0.37 microsecond mark, quantizer output is rising but not overloaded as the PVCO 4 ring transition 54 leads the NVCO 6 ring transition 56 by slightly less than $2\pi$ radians. At this time, PVCO transition 54 can be envisioned as propagating clockwise. At time (b), however, just after the 0.41 microsecond mark, the transition of PVCO 4 laps the transition of NVCO 6 (i.e., the PVCO 4 ring transition 54 propagates further clockwise to lead the NVCO 6 ring transition 56 by slightly more than $2\pi$ radians) and the feedback sign is incorrectly wrapped. This results in a saturation of the first order. At time (c), around 0.52 microseconds, PVCO 4 transition 54 passes NVCO 6 transition 56 again after another $2\pi$ radian clockwise propagation and wraps the feedback sign again, causing valid negative feedback 60. This is saturation of the second order.

At time (d) in FIG. 5, just after 1.1 microseconds, the transition 54 of PVCO 4 has changed direction, and at time (e), just after 1.2 microseconds, PVCO 4 transition 54 has passed NVCO 6 transition 56 in the counterclockwise direction, resulting in an incorrect feedback sign. Again, the quantizer 3 is in saturation of the first order. At time (f), closer to 1.3 microseconds, PVCO 4 transition 54 has passed NVCO 6 transition 56 in the counterclockwise direction again, providing the correct feedback since the VCOs 4, 6 have become unwrapped. The bump 64 in wrapped quantizer output in the 1.4 to 1.9 microsecond range shows the above-described "low saturation" where the PVCO 4 transition 54 continues in the same direction, i.e., counterclockwise, and again passes the NVCO 6 transition 56.

When the quantizer 3 is in a saturation mode, ADC 1 is expected to deliver a constant output demonstrated at 62. Logics 22, 58 can ensure that the ADC 1 operates as expected even though quantizer 3 is in saturation. Detection logic 22, which can culminate in saturation detector 38, can detect if saturation has occurred. Correction logic 58 can ensure correct quantizer operation by enforcing appropriate quantizer outputs during saturation based on the output(s) of detection logic 22, for example, saturation detector 38. When high saturation 62 has occurred, the output 14 of the quantizer and hence the feedback signal can be forced to its maximum value to lower the frequency of PVCO 4. This can result in the pointer 54 of the PVCO 4 propagating counterclockwise and eventually exiting the saturation state. When low saturation has occurred, the logic can generate a constant low output 66. The logic 22 can also determine when the quantizer 3 has left saturation, so as to then cause the ADC 1 output 14 to start to follow the quantized output 7 at that moment.

As shown in FIG. 2, quantizer saturation detection logic 22 can include transition detector 34. Transition detector 34 can include logic to (a) determine which delay element in the PVCO 4 currently is in transition, and (b) read the output 7 of combining logic 12 corresponding to that particular element in transition.

Figure 6:
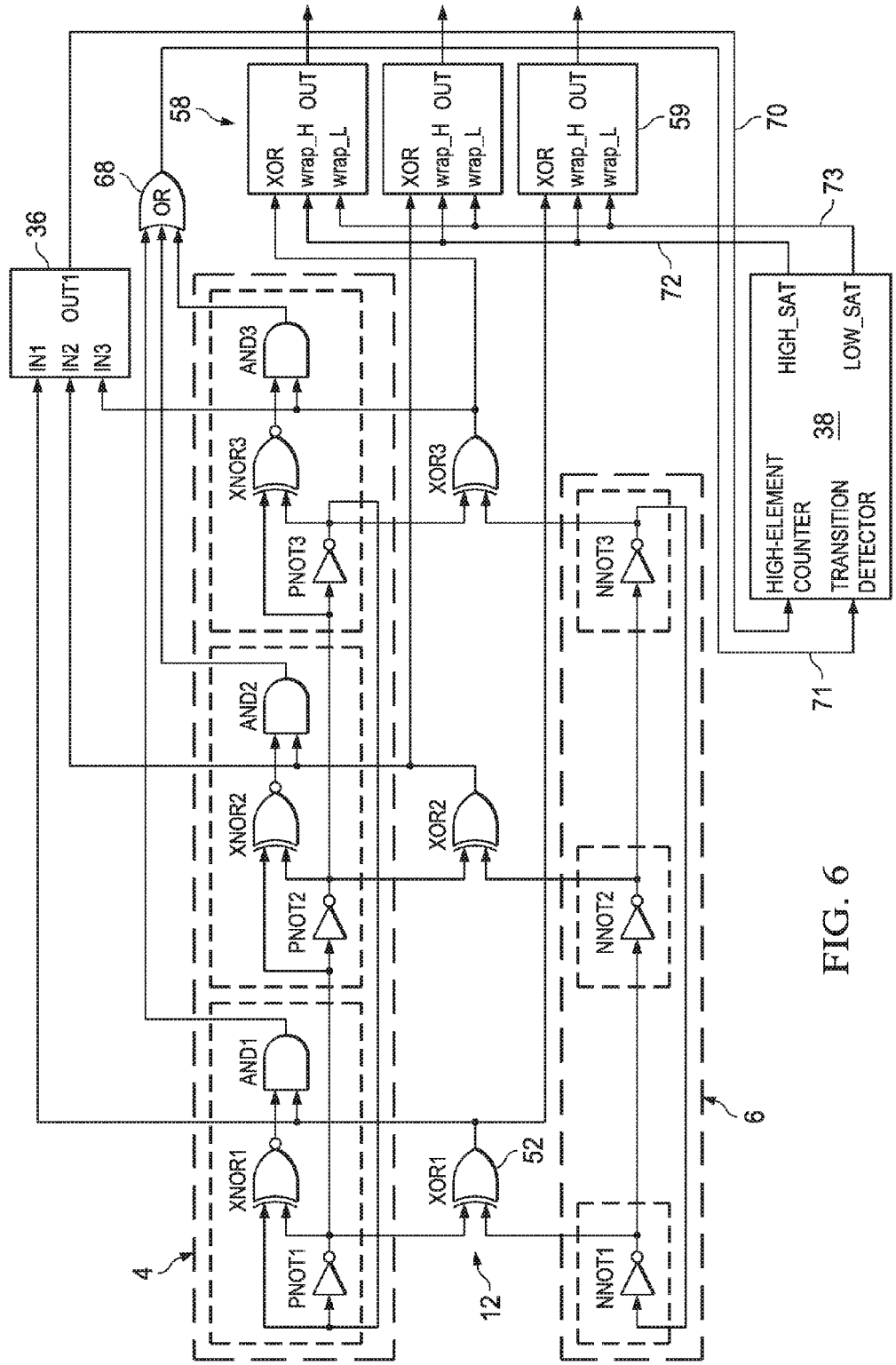
FIG. 6 shows an example block diagram of a VCO-based ADC that includes overload detection and correction logic.

FIG. 6 shows an example of an arrangement of saturation detection logic 22 and correction logic 58. For simplicity of illustration, the example in FIG. 6 depicts only 3-element RO-VCOs as VCOs 4, 6, but the example can be extended to VCOs having rings of any number of delay elements, which elements are represented in the drawing by dashed-line boxes with rounded corners. The delay elements of PVCO 4 are shown as including inverters labeled PNOT1, PNOT2, and PNOT3, which are arranged in a ring. Similarly, the delay elements of NVCO 6 are shown as inverters NNOT1, NNOT2, and NNOT 3, which are likewise arranged in a ring. The outputs of corresponding inverters from each element feed into corresponding sub-units of combining logic 12, illustrated in FIG. 6 as XOR gates in an XOR array.

Comparing PVCO 4 with NVCO 6, it can be noted that PVCO 4 can include additional logic that, along with OR gate 68, can form part of transition detector 34 from FIG. 2. Instead of only an inverter, each delay element in PVCO 4 can have, for example, one additional XNOR gate and one additional AND gate. The AND gate in each element can generate a logical "high" output if the corresponding element is in transition and the output of the XOR gate (or, more generally, combining logic sub-unit) that corresponds to the element is "high."

These additional gates in each PVCO delay element can provide an additional output which can be connected to a common OR gate 68 having a number of inputs equal to the number of slices (e.g., equal to the number of delay elements each ring). Thus, OR gate 68 has only three inputs in the simplified example illustrated in FIG. 6, but would have twenty-five inputs in an example in which VCOs 4, 6 had twenty-five delay elements each (as shown in FIG. 3). OR gate 68 can generate a "high" output if any of the AND gates associated with the PVCO delay elements generate a "high" output. The output 70 of OR gate 68 can thereby provide the output 70 of transition detector 34 (from FIG. 2) that can be used by saturation detector 38 to detect saturation.

Although omitted from FIG. 6 for the sake of simplicity of illustration, input signal 2 in FIG. 1 could be illustrated as rail inputs to each of the inverters in the rings of VCOs 4, 6. Also omitted from illustration in FIG. 6 is any circuitry to isolate from kickback noise and/or to provide sampling of VCO outputs 5 and/or quantized outputs 7 at sample rate $f_s$. Such circuitry could be included before and/or after the sub-units of combining logic 12 (illustrated as XOR gates in array 12). Additionally, although FIG. 6 illustrates an example in which only one VCO 4 includes additional logic to provide transition detection, in some examples transition detector 34 can encompass logic and/or connections to multiple VCOs. Connection to multiple VCOs may, for example, provide improved timing for saturation detection logic 22.

High-element counter 36 from FIG. 2 is also illustrated in FIG. 6. The purpose of high-element counter 36 is to provide a signal useful in ascertaining whether a particular instance of VCO wrapping is likely to have resulted in entering a high saturation or a low saturation. To that effect, high-element counter 36 can, for example, determine, with binary resolution, the proportion of sub-units in combining logic 12 (e.g., the proportion of XOR gates in the array of XOR gates) with a logical "high" output to sub-units in combining logic 12 (e.g., gates in the array) with a logical "low" output. High-element counter 36 can have a number of inputs equal to the number of slices, e.g., equal to the number of sub-units in combining logic 12 (e.g., gates in XOR array 12). The inputs of high-element counter 36 can, for example, be connected directly to the outputs of XOR gates in array 12, as shown in FIG. 6.

High-element counter 36 can include logic to determine the number of "high" elements and provide an appropriate output. For example, if more than half of the gates in XOR array 12 are delivering a "high" output, high-element counter can deliver an output of 1, otherwise 0. Thus, for example, where each VCO 4, 6 has twenty-five delay elements, the high-element counter can provide a "high" output if the number of "high" XOR array 12 gate outputs is greater than twelve, or a "low" output if the number of "high" XOR array 12 gate outputs is less than thirteen. To achieve its output, high-element counter 36 can include, for example, a counter or a comparator, there may be many arrangements capable of achieving the desired result of high-element counter 36. The high-element counter 36 can include, for example, a number of AND gates, the number equal to the binary logarithm of the number of slices.

Saturation detector 38 from FIG. 2 is likewise illustrated in FIG. 6. Saturation detector 38 can use the outputs from the transition detector 34 and the high-element counter 36 to determine the state of the quantizer. The outputs of saturation detector 38 can be in the form of two signals 72, 73, herein denoted HIGH_SAT and LOW_SAT, respectively. Saturation detector 38 can receive the outputs 70, 71 of transition detector 34 and high-element counter 36 to detect four different states of the quantizer: (1) when the quantizer has entered a high saturation state; (2) when the quantizer has left a high saturation state; (3) when the quantizer has entered a low saturation state; or (4) when the quantizer has left a low saturation state.

HIGH_SAT 72 and LOW_SAT 73 both reading "low" can signify that quantizer 3 is not saturated and is operating as expected. In such case, there is no need to enforce alternative quantizer outputs, and correction logic 58 can pass quantized outputs 7 as multi-bit digital output 14. HIGH_SAT 72 reading "high" can signify that quantizer 3 is in a state of high saturation, in which case correction logic 58 can bypass quantized outputs 7, forcing ADC 1 to deliver a constant maximum output at output 14 until the saturation detector 38 senses that quantizer 3 has left high saturation. LOW_SAT 73 reading "high" can signify that quantizer 3 is in low saturation, in which case correction logic 58 can bypass quantized outputs 7, forcing ADC 1 to deliver a constant minimum output at output 14 until the saturation detector 38 senses that the quantizer 3 has left low saturation.

As with transition detector 34 and high-element counter 36, saturation detector 38 can take on a number of different forms. Given the described inputs, saturation detector 38 can have a number of different configurations, or architectures, to provide the intended HIGH_SAT 72 and LOW_SAT 73 output signals. The description herein provides but one example.

Figure 7:
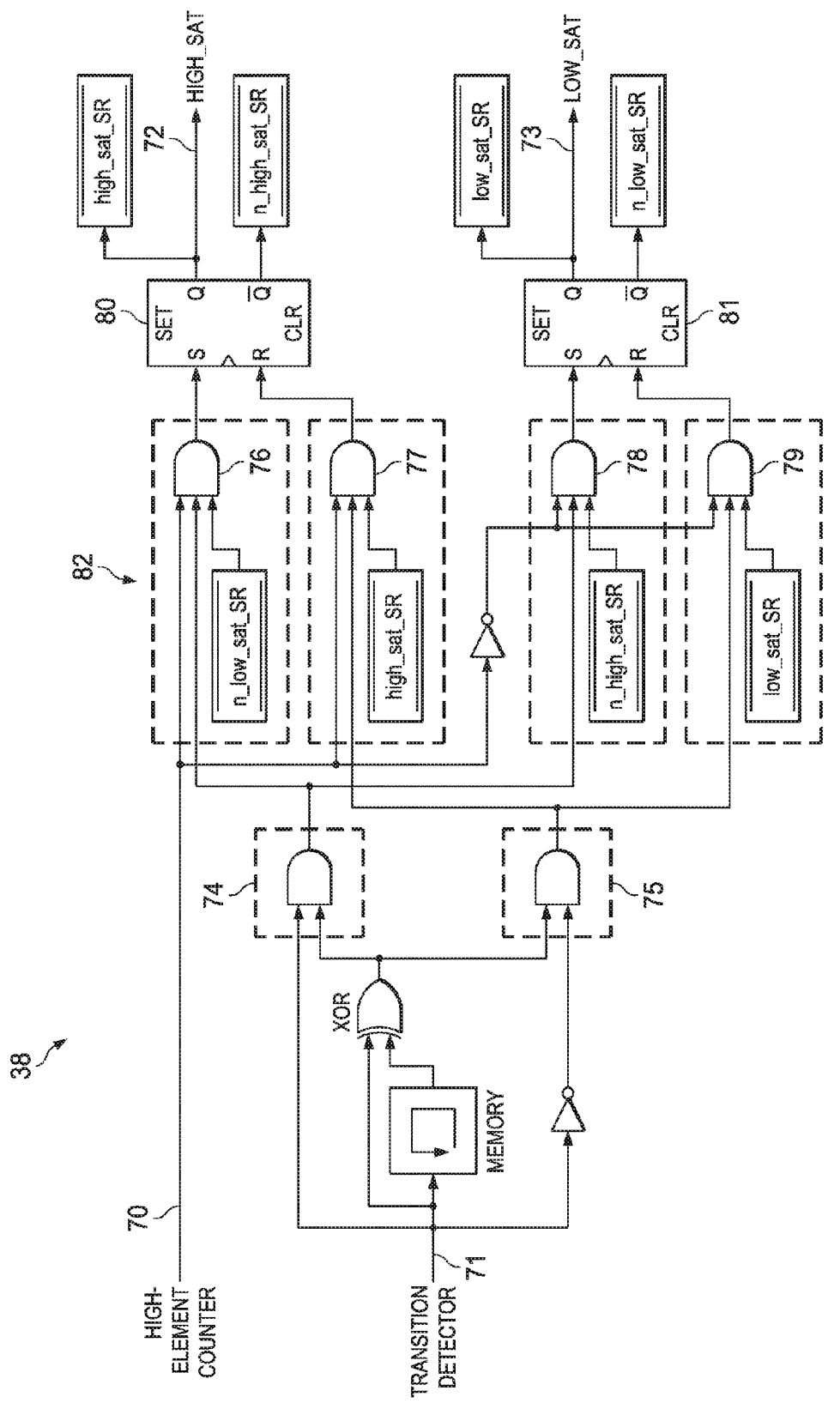
FIG. 7 is a block diagram of an example saturation detector.

In the example block diagram of FIG. 7, saturation detector 38 can include input 70 from high-element counter 36, input 71 from transition detector 34, HIGH_SAT signal output 72, LOW_SAT signal output 73, sequence detectors 74, 75, and four saturation state detectors 82, denoted by dashed-line boxes, that can principally comprise AND gates 76, 77, 78, 79. As discussed previously, high-element counter input 70 determines whether the number of logical "high" outputs from combining logic 12 (e.g., from an XOR array) is larger than half the total number of outputs from combining logic 12 (e.g., the XOR array). The sequence detectors 74, 75 can sense the pattern from the transition detector 34, the output of which is provided as an input 70 to the saturation detector 38. One sequence detector 74 can output a "high" pulse for a "low-high" sequence, i.e. if the output 71 of the transition detector 34 toggles from zero to one. The other sequence detector 75 can output a "high" pulse for a "high-low" sequence, i.e., if the output 71 of the transition detector 34 toggles from one to zero.

The saturation state detectors 82 can be used to sense the states of the VCO-based quantizer 3. Each of the possible states (e.g., entering high saturation, leaving high saturation, entering low saturation, leaving low saturation) can be represented by an output of one of the AND gates 76, 77, 78, 79. The outputs of the AND gates 76, 77, 78, 79 can be connected to SR latches 80, 81, as shown in FIG. 7, to set/reset each state.

By way of example, the "entering high saturation" state can be indicated by an output of AND gate 76 that is logical "high" if the output 70 of the high-element counter 36 indicates that more than half of the XOR gates in array 12 are logical "high," AND the transition detector output 71 toggles from "low" to "high," AND the quantizer is NOT previously in low saturation. If these conditions are all met, AND gate 76 will set SR latch 80 and provide a "high" output on HIGH_SAT output signal 72, indicating that the quantizer is in a high saturated state.

The "leaving high saturation" state can be indicated by an output of AND gate 77 that is logical "high" if the output 70 of the high-element counter 36 indicates that more than half of the XOR gates in array 12 are logical "high," AND the transition detector output 71 toggles from "high" to "low," AND the quantizer is previously in high saturation. If these conditions are all met, AND gate 77 will reset SR latch 80 and provide a "low" output on HIGH_SAT output signal 72, indicating that the quantizer is not in a high saturated state, and thus may be in an operational state (provided LOW_SAT is also "low").

The "entering low saturation" state can be indicated by an output of AND gate 78 that is logical "high" if the output 70 of the high-element counter 36 indicates that half or fewer of the XOR gates in array 12 are logical "high," AND the transition detector output 71 toggles from "low" to "high," AND the quantizer is NOT previously in high saturation. If these conditions are all met, AND gate 78 will set SR latch 81 and provide a "high" output on LOW_SAT output signal 73, indicating that the quantizer is in a low saturated state.

The "leaving low saturation" state can be indicated by an output of AND gate 79 that is logical "high" if the output 70 of the high-element counter 36 indicates that half or fewer of the XOR gates in array 12 are logical "high," AND the transition detector output 71 toggles from "high" to "low," AND the quantizer is previously in low saturation. If these conditions are all met, AND gate 79 will reset SR latch 81 and provide a "low" output on LOW_SAT output signal 73, indicating that the quantizer is not in a low saturated state, and thus may be in an operational state (provided HIGH_SAT is also "low").

When HIGH_SAT output signal 72 is "high," quantizer 3 is in a state of high saturation, and its outputs 7 can be bypassed by correction logic 58 to give constant maximum output at output 14. When LOW_SAT output signal 73 is "high," quantizer 3 is in a state of low saturation, and its outputs 7 can be bypassed by correction logic 58 to give constant minimum output at output 14.

Returning now to FIG. 6, the bypassing, corresponding to the enforcement of high or low saturated output, can be controlled by correction logic 58, which can consist of a number of correction controllers, the number of correction controllers being at least equal to the number of VCO slices. Each correction controller in correction logic 58, e.g., first element controller 59 as illustrated in FIG. 6, can receive as inputs the output of a corresponding combining logic sub-unit (e.g., XOR gate from array 12) and the HIGH_SAT and LOW_SAT signals 72, 73 delivered by saturation detector 38. The output of each correction controller in correction logic 58 supplants the output of each corresponding combining logic sub-unit (e.g., each gate in XOR array 12) and can be fed to a corresponding element of multi-bit DAC 18 as seen in FIG. 1. Collectively, the outputs of the correction logic 58 can form multi-bit digital output 14 such as shown in FIG. 1. Each correction controller can include the logic shown in FIG. 14.

Figure 8:
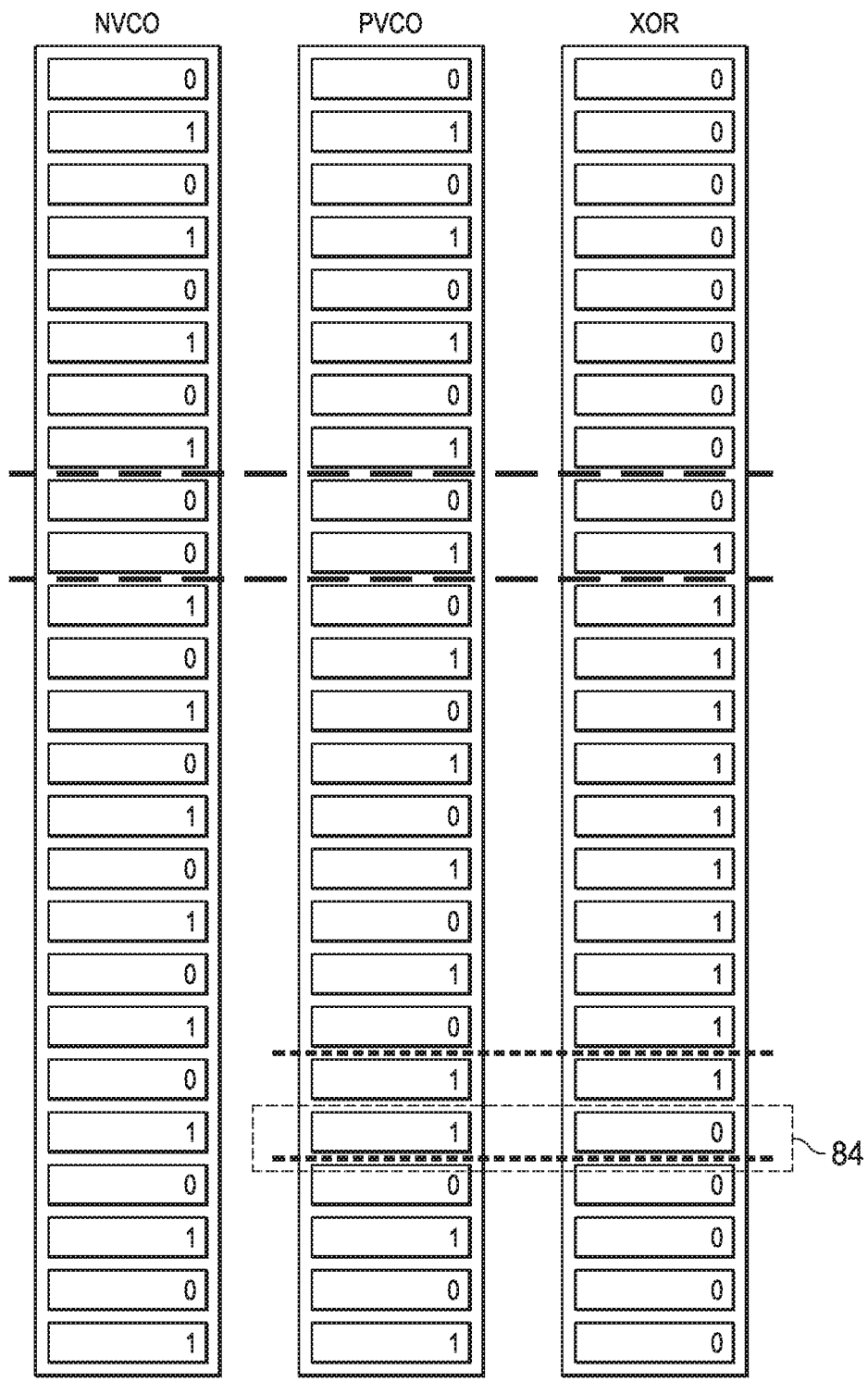
FIGS. 8 and 9 each illustrate examples of XOR gate outputs for various NVCO and PVCO element outputs, with the element in transition highlighted.
Figure 9:
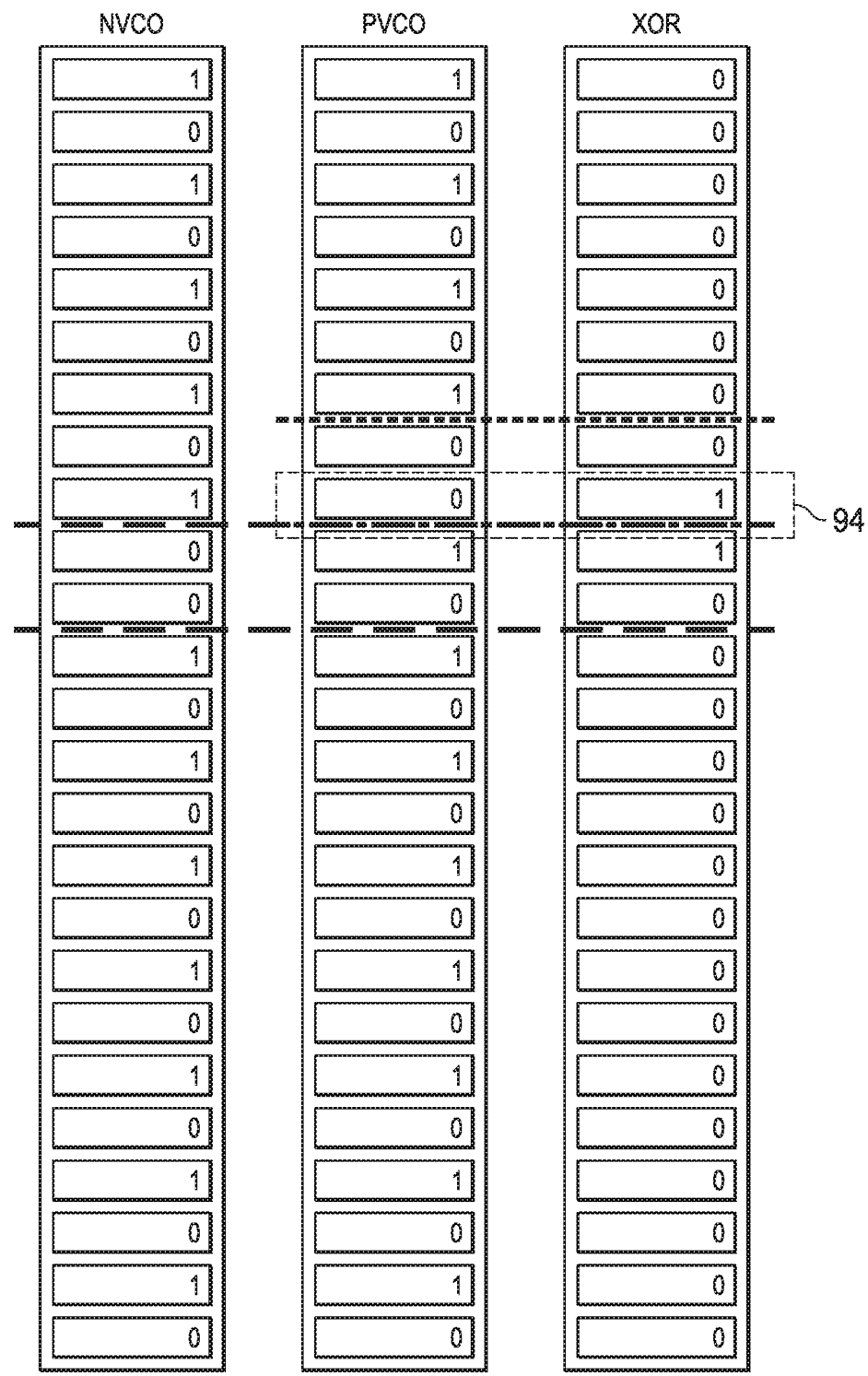

The functioning of the quantizer saturation detection logic 22 and correction logic 58 can be summarized as follows. The logic 22 can analyze the output pattern for combining logic 12, or more precisely, for example, the XOR output for the PVCO 4 element in transition 54. This output is referred to herein as XOR_state. XOR_state is indicated by boxes 84, 94 for each state in FIGS. 8 and 9. FIG. 8 illustrates combining logic outputs without quantizer saturation, whereas FIG. 9 shows combining logic outputs when quantizer 3 is saturated. As seen in FIGS. 8 and 9, the XOR_state will be logical "high" when in saturation and logical "low" when not in saturation. This is, however, only valid for saturation of the first order. If the saturation exceeds a full rotation, the XOR_state will be inverted and hence will indicate no saturation when, in reality, the quantized output 5 is saturated. Therefore, reference to XOR_state alone may be insufficient to detect saturation.

Figure 10:
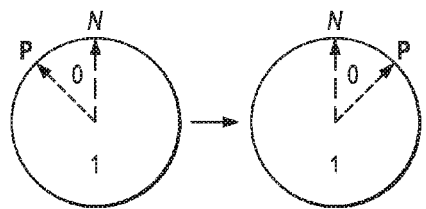
FIGS. 10-13 are examples of quantizer phase diagrams showing transition resulting in the quantizer entering different saturation states.

The transition resulting in quantizer 3 entering high saturation is given by FIG. 10. When quantizer 3 enters high saturation, XOR_state will toggle from 0 to 1. If that occurs while the sum of the outputs of the combining logic sub-units is close to its maximum and quantizer 3 is not in low saturation, it can be determined that quantizer 3 has entered high saturation. The parameters for indicating entering high saturation are given by the below table:

| State | Quantized output | XOR_state | Action |
|---|---|---|---|
| Previous state | Close to maximum | 0 | No saturation |
| Current state | Close to maximum | 1 | High saturation entered |

Figure 11:
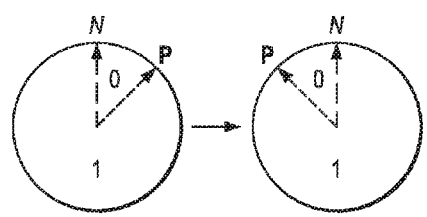

The transition resulting in quantizer 3 leaving high saturation is given by FIG. 11. If quantizer 3 has entered high saturation and XOR_state goes from 1 to 0, while the sum of the outputs of the combining logic sub-units is close to maximum, it can be determined that quantizer 3 has left high saturation. The parameters indicating that quantizer 3 has left high saturation are given by the below table:

| State | Quantized output | XOR_state | Action |
|---|---|---|---|
| Previous state | Close to maximum | 1 | High saturation |
| Current state | Close to maximum | 0 | Left high saturation |

Figure 12:
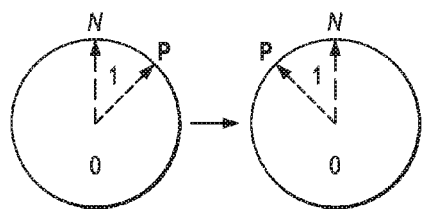

The transition resulting in quantizer 3 entering low saturation is given by FIG. 12. If XOR_state goes from 0 to 1 while the sum of the outputs of the combining logic sub-units is close to minimum and quantizer 3 is not in high saturation, it can be determined that quantizer 3 has entered low saturation. The parameters indicating that quantizer 3 has entered low saturation are given by the below table:

| State | Quantized output | XOR_state | Action |
|---|---|---|---|
| Previous state | Close to minimum | 0 | No saturation |
| Current state | Close to minimum | 1 | Low saturation entered |

Figure 13:
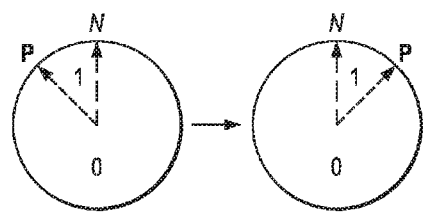

The transition resulting in quantizer 3 leaving low saturation is given by FIG. 13. If quantizer 3 has entered low saturation and XOR_state goes from 1 to 0, while the sum of the outputs of the combining logic sub-units is close to minimum, it can be determined that quantizer 3 has left low saturation. The parameters indicating that quantizer 3 has left low saturation are given by the below table:

| State | Quantized output | XOR_state | Action |
|---|---|---|---|
| Previous state | Close to minimum | 1 | Low saturation |
| Current state | Close to minimum | 0 | Left low saturation |

Control signals HIGH_SAT 72 and LOW_SAT 73 generated by logic in saturation detector 38 can indicate high and low saturation, respectively. These signals can be fed into correction logic 58 to ensure the quantizer operation by overriding outputs of XOR array 12 as appropriate.

ADC 1 can thus deliver maximum output when quantizer 3 is in high saturation and minimum output when quantizer 3 is in low saturation, and can be made to otherwise follow the outputs of the combining logic (e.g., XOR array) 12. The two control signals HIGH_SAT 72, LOW_SAT 73 are provided as to not be logical "high" concurrently. This results in the truth table given below:

| XOR_out | HIGH_SAT | LOW_SAT | Out |
|---|---|---|---|
| 0 | 0 | 0 | 0 |
| 0 | 0 | 1 | 0 |
| 0 | 1 | 0 | 1 |
| 0 | 1 | 1 | — |
| 1 | 0 | 0 | 1 |
| 1 | 0 | 1 | 0 |
| 1 | 1 | 0 | 1 |
| 1 | 1 | 1 | — |

Figure 14:
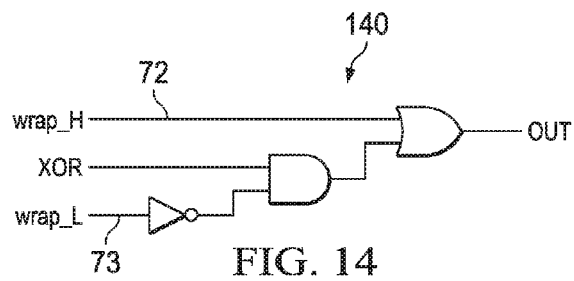
FIG. 14 illustrates example logic for a single correction controller in saturation correction logic shown in FIG. 6.

This truth table results in the logical equation Out=HIGH_SAT$\vee$(XOR_out$\wedge$LOW_SAT). The equivalent logic 140 in FIG. 14 can be used to generate the appropriate output for each VCO element to prevent quantizer saturation. For example, logic 140 from FIG. 14 can be used in each of the plurality of correction controllers in correction logic 58 shown in FIG. 6. In each correction controller, the output of a combining logic sub-unit (labeled XOR_out) can be provided as an input together with the outputs of the two control signals HIGH_SAT 72 and LOW_SAT 73 from saturation detector 38. For each correction controller, saturation detector outputs HIGH_SAT 72 and LOW_SAT 73 can be provided to inputs wrap_H, wrap_L, respectively, as shown in FIGS. 6 and 14.

In view of logic 140, and with reference again to FIG. 5, ADC 1 can provide the correct output without wrapping. In state (b), the combining logic output 7 is ignored and the ADC output 14 is constant maximum 62. Between states (c) and (e), the PVCO 4 transition 54 changes direction and propagates counterclockwise to leave saturation. In state (f), quantizer 3 has left saturation and ADC output 14 follows the combining logic output 7. In the case of a low saturation as shown after 1.4 microseconds, a constant minimum output 66 is delivered at output 14.

The described saturation detection logic 22 and correction logic 58 can enable that ADC 1 can operate without exhibiting undesirable overload behavior when quantizer 3 is in any of several saturation states. When using ADC 1 in a receiver (Rx) chain, this advantage reduces the requirements in gain adjustments for other blocks in the chain since proper ADC operation is ensured, obviating the need for pre-quantizer gain reduction to avoid saturation. Quantizer saturation can occur particularly when using the ADC as a radio receiver ADC (Rx-ADC). Thus, logics 22, 58 can ensure the ability of ADC 1 to recover from saturated states.

ADC 1 as provided with logics 22, 58 exhibits performance benefits over ADC 1 when lacking logics 22, 58. Signal-to-noise ratio (SNR) is a measure of signal power as compared to noise power. A typical Rx-ADC need only have a SNR that exceeds approximately 10 dB to accurately distinguish a received signal, e.g, to demodulate a weak desired signal in presence of a strong unwanted signal on a neighboring channel. However, the amplitude of the received signal is not easy to control, since the received signal typically is transmitted over an application-dependent distance. Varying input signal power can be adjusted with a variable gain amplifier (VGA) in front of the ADC, but low ADC dynamic range can complicate the VGA as more gain steps may be needed.

Figure 15:
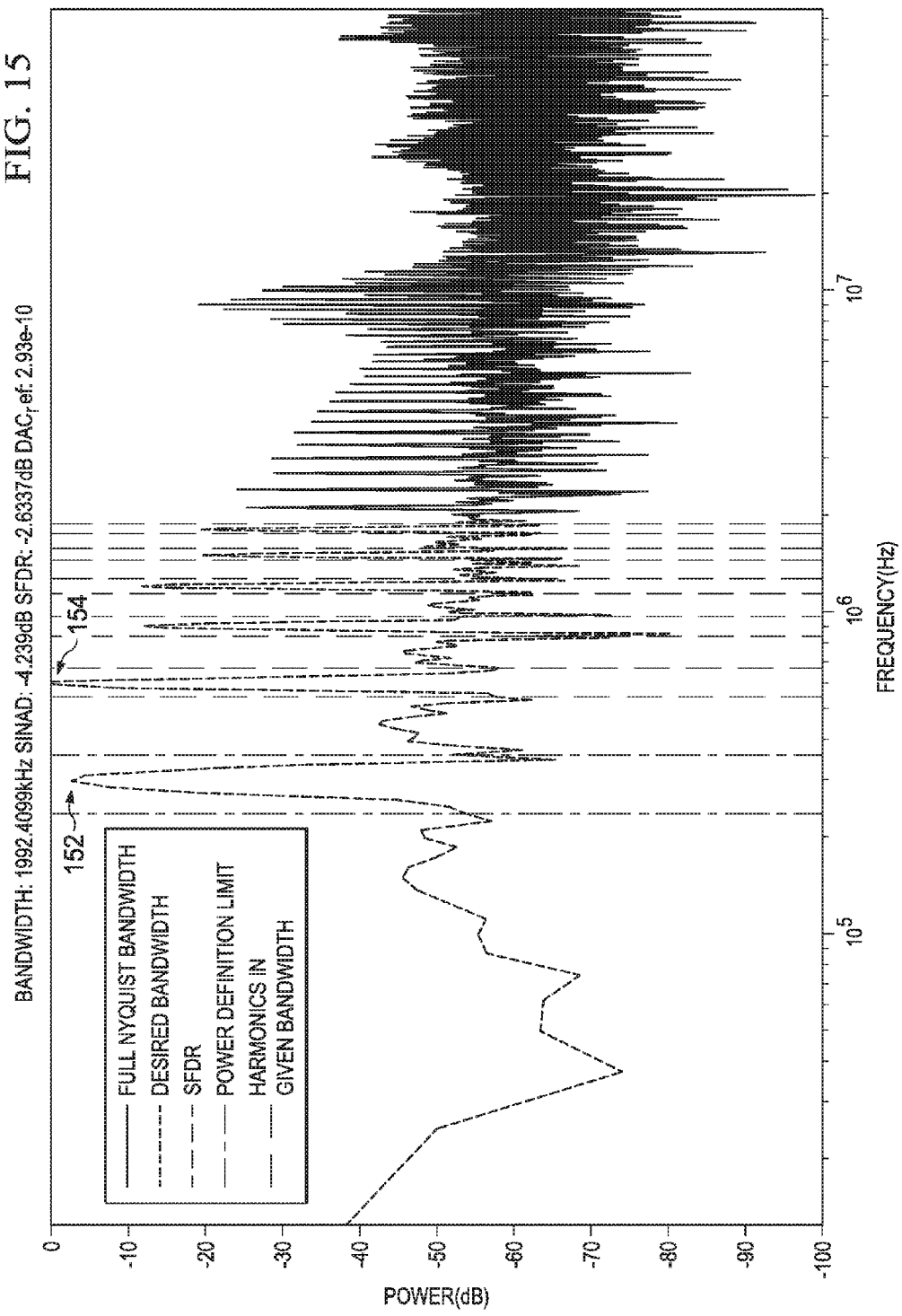
FIG. 15 shows an example of the output spectrum of the ADC of FIG. 1 lacking saturation detection and correction logic.

Hence, an Rx-ADC must be able to receive strong input signals and still detect the correct frequency input. However, if the Rx-ADC lacks logics 22, 58, the design of ADC 1 is limited in converting signals with an amplitude over a certain limit. As shown in the example power spectral density (PSD) plot of FIG. 15, illustrating the output of ADC 1 absent logics 22, 58, with an input signal 2 of sufficient amplitude, quantizer 3 of ADC 1 fails to detect the correct input signal (in the illustrated example, an input frequency of 300 kHz) due to the second harmonic 154 which exceeds the signal power level 152 at the input frequency. This is due to quantizer saturation explained previously.

Figure 16:
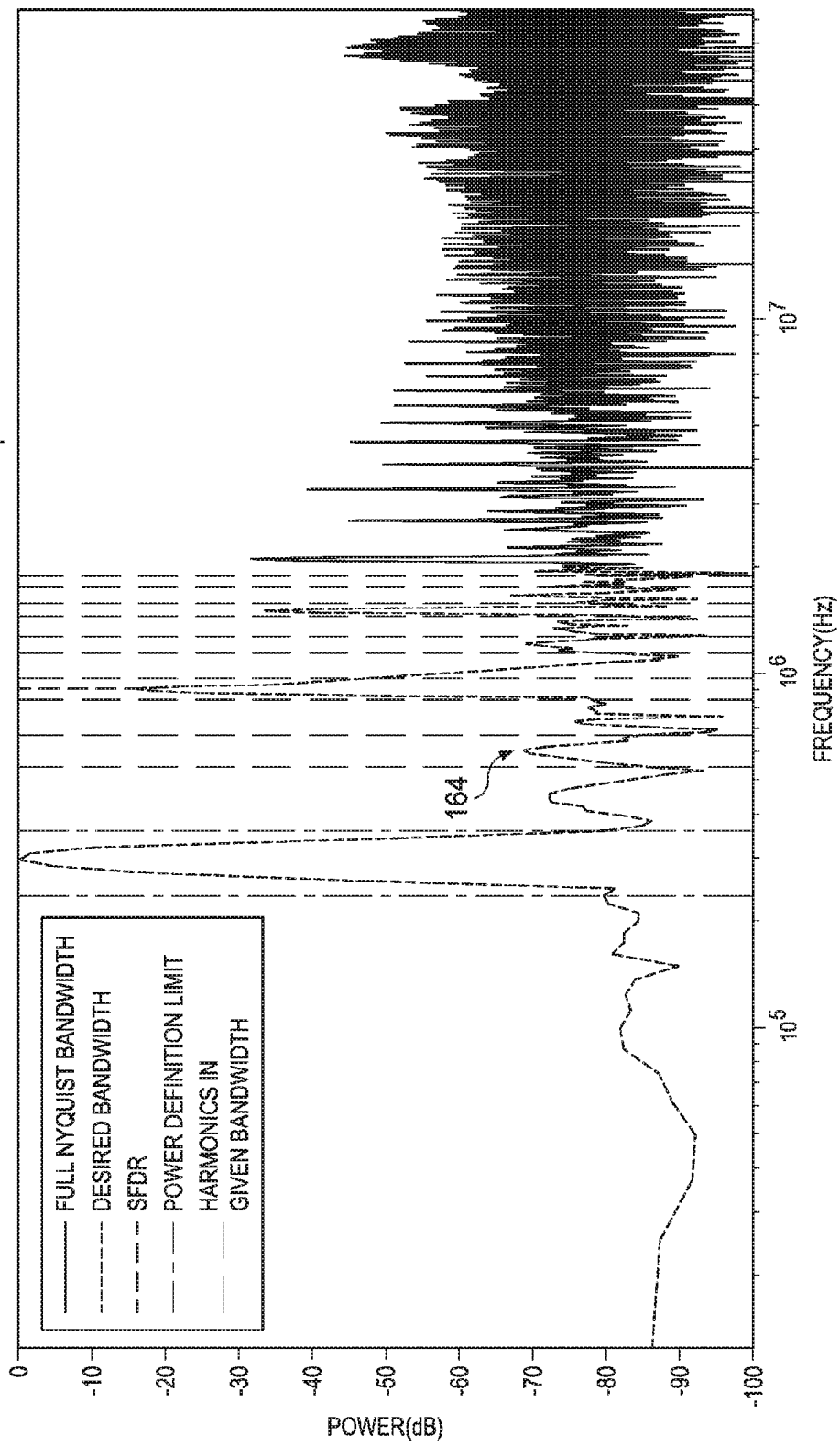
FIG. 16 shows an example of the output spectrum of the ADC of FIG. 1 having saturation detection and correction logic.

FIG. 15 shows the output spectrum of first-order ADC 1 without the above-described saturation detection and correction logics 22, 58, while FIG. 16 shows the output spectrum of the first-order ADC 1 as provided with the above-described saturation detection and correction logic 22, 58. As can be seen by comparing FIGS. 15 and 16, logics 22, 58 can remove the second harmonic 154 that results from quantizer saturation. As can be seen in FIG. 16, the logics 22, 58 results in an about 20 dB second harmonic reduction 164 and noise floor reduction.

Figure 17:
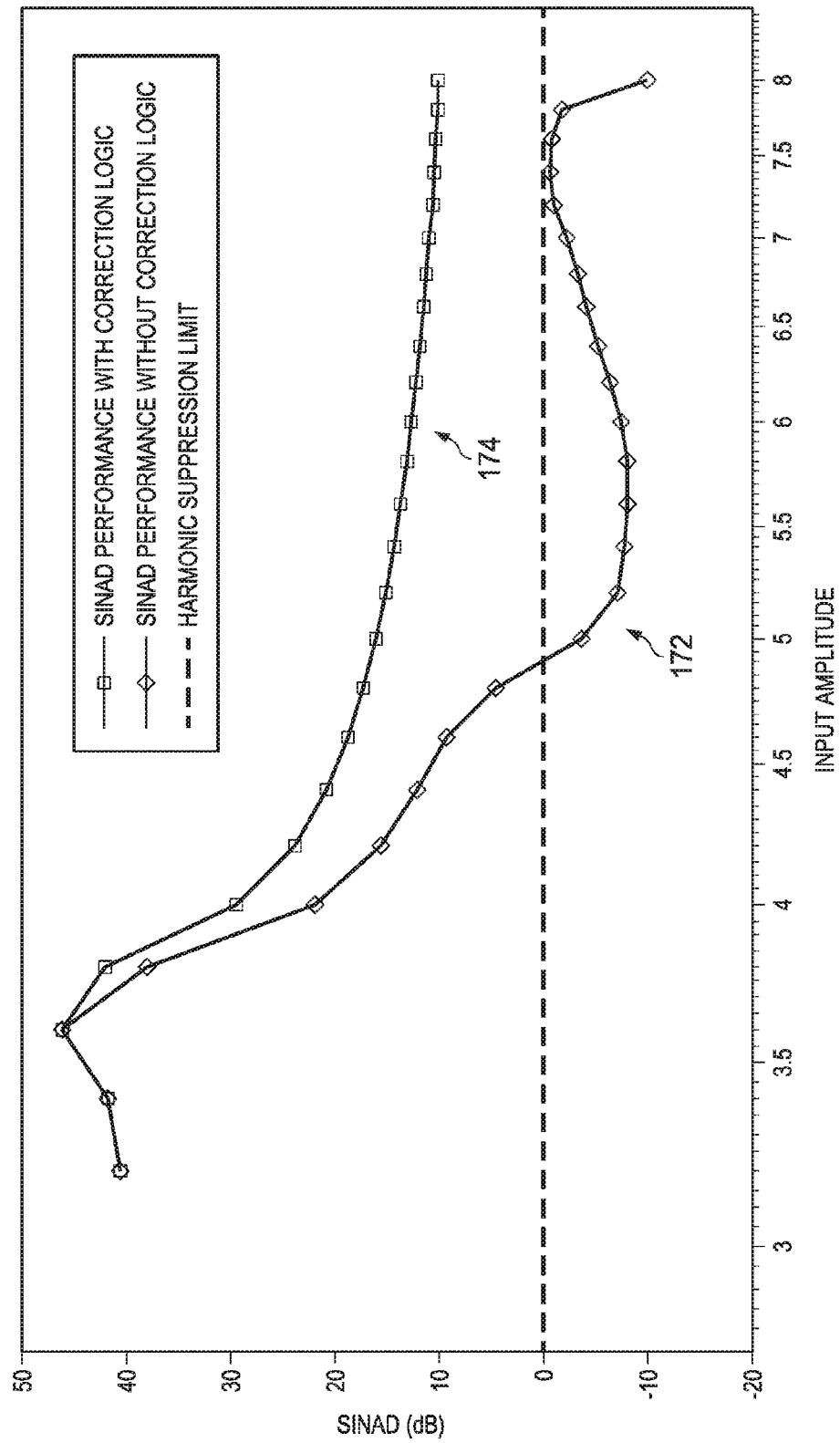
FIG. 17 shows example plots of SINAD as a function of input amplitude for the ADC of FIG. 1 when it lacks and includes saturation detection and correction logic.

The saturation detection and correction logics 22, 58 make ADC 1 more usable as a radio receiver ADC (Rx-ADC). In addition, even with a lower amplitude, where the original ADC can detect the output frequency, logics 22, 58 improve the dynamic metrics performance. FIG. 17 shows two signal-to-noise and distortion ratio (SINAD) plots, each the result of an overloading input, one for ADC 1 as shown in FIG. 1 with logics 22, 58 and one for ADC 1 when logics 22, 58 are not provided to properly override quantizer saturation. SINAD is defined as the ratio between the signal power and the sum of both noise and all harmonic components. The units of the input amplitude axis are shown as normalized units.

In the illustrated plots in FIG. 17, quantizer 3 enters saturation at an input amplitude of 3.8 units. It can be seen from the plots that for higher-amplitude inputs, ADC 1 using logics 22, 58 performs better than without. For example, at an input of 5 units, the second harmonic exceeds the signal frequency power and the SINAD 172 for the ADC 1 without logics 22, 58 falls below the harmonic suppression limit. By contrast, ADC 1 with logics 22, 58 performs with a positive SINAD 174 (~10 dB) for all input levels.

The saturation detection and correction logics 22, 58 thus remove the second harmonic from the power spectral density of the ADC output 14. This improves the performance of ADC 1 and makes ADC 1 more applicable as a radio receiver ADC, where the received frequency needs to be detected even for a high amplitude and separated from the noise with about a 10 to 15 dB SNR.

ADC 1 with logics 22, 58 can provide a high-performance multi-bit feedback ADC that permits for a simpler front-end with fewer gain adjustments, since the dynamic range of the ADC is bigger. Because the architecture of ADC 1 is VCO-based, it can be more area and power efficient as compared to operational other ADC architectures, can operate well under low power supply, and can improve in performance at smaller CMOS scales because the increase of transistor speed at smaller scales results in a shorter inverter delay and thus a higher timing resolution.

VCO-based ADC 1 can encode input information in a time domain whereas other ADC architectures may encode input information in an amplitude domain where saturation can limit accuracy for high input signals and the noise floor for low input signals. In such architectures, with reduced supply, the maximum signal amplitude is reduced, which can also reduce the usable dynamic range. When input information is encoded in a time domain, as with VCO-based ADC 1, there is no direct binding between supply and maximum input signal.

Figure 18:
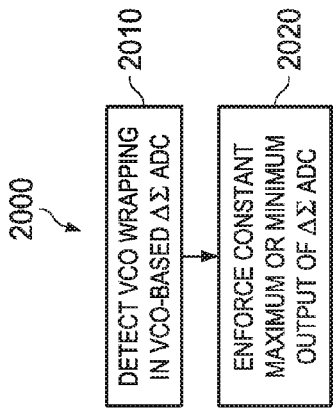
FIG. 18 shows an example general differential integrator that can be used to further modify the ADC of FIG. 1.

The provision of logics 22, 58 further permit ADC 1 to be modified to have a higher loop order. As noted previously, the architecture of ADC 1 can uses a dual VCO as both integrator and quantizer. By using a VCO-based integrator, first-order noise shaping is achieved without using any dedicated integrator in the loop filter 20. By introducing an additional integrator in the loop filter 20, a second order integration can be achieved. This can generate a second order, 40 dB/decade noise shaping. FIG. 18 shows an example general differential integrator 180 with good noise performance and linearity that can be used to modify ADC 1. The gain of integrator 180 depends ideally on the size of capacitors C and resistors $R_i$. The gain from the added integrator can increase the loop gain of ADC 1.

Besides offering second-order or higher-order noise shaping, the input impedance of the integrator as modified by additional integrator 180 in the loop filter may be dominated by the input resistance which can be much lower than the input impedance of the VCO. The lower impedance can be a benefit for multiple reasons. First, the input impedance can be controlled and linear, which is not the case in ADC 1. Second, in ADC 1, the DAC 18 is directly connected to the input of the VCOs 4, 6. By adding an additional integrator in the loop filter, the voltage swing at the DAC 18 output can be reduced due to the virtual ground at the integrator input. Having a large voltage swing at the DAC 18 output may introduce inter-symbol interference (ISI), meaning that the state of the current sample may be affected by the previous state. In addition, the kickback to the signal source at the ADC input 2 can be reduced due to the lower input impedance which can have less variation than in ADC 1.

Figure 19:
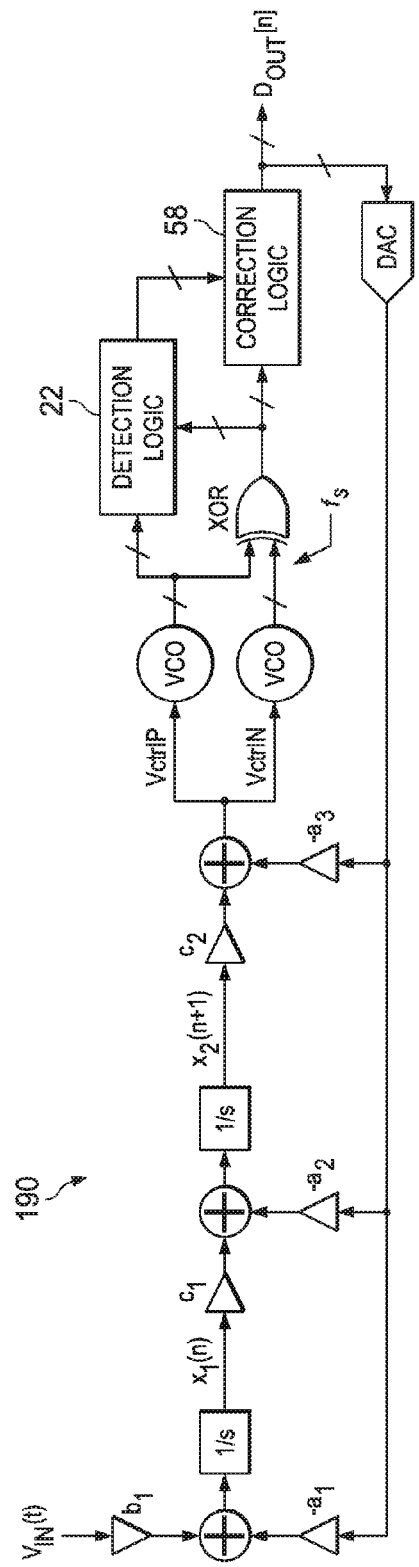
FIG. 19 shows an example higher-order ADC that can be constructed when the ADC of FIG. 1 is modified by the saturation detection and correction logic.

The above-described modifications to ADC 1 not only solve the problem of erratic behavior in an overload condition, but also permit for implementation of a higher-order ADC (i.e., an ADC with an order higher than one) with a far more robust and manufacturable input stage for the ADC. FIG. 19 shows an example of such a higher-order ADC 190 that can be constructed when the dual-VCO integrator/quantizer includes the detection logic 22 and correction 58 logic disclosed herein.

The benefits of the disclosed architecture further include cost reduction and chip footprint area reduction versus different designs having comparable performance. When fabricated, a VCO-based ADC as described herein may occupy 0.06 mm² chip area or less, whereas a comparable-performing design may occupy about 0.2 mm².

Figure 20:
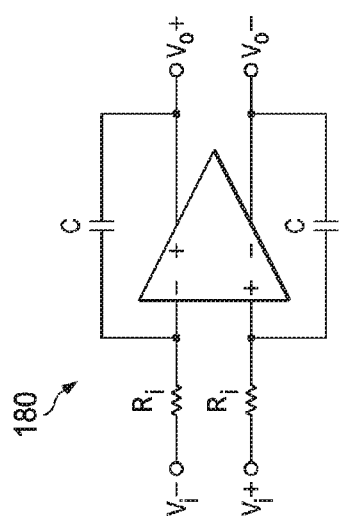
FIG. 20 is a flow chart showing an example method of generating predictable behavior in a ΔΣ ADC based on a dual-VCO integrator/quantizer.

The present disclosure provides various methods of generating predictable behavior in a ΔΣ ADC based on a VCO-based quantizer. Examples of such methods are illustrated in the flow charts of FIGS. 20-21. In the example shown in FIG. 20, the method 2000 can include detecting 2010 VCO wrapping in the dual-VCO integrator quantizer, and enforcing 2020 a maximum or zero output of the ΔΣ ADC based on the detecting. The detecting 2010 can be done, for example, using detection logic 22, as shown in FIGS. 1, 6, and 7, while the enforcing 2020 can be implemented, for example, using correction logic 58, as shown in FIGS. 6 and 14.

Figure 21:
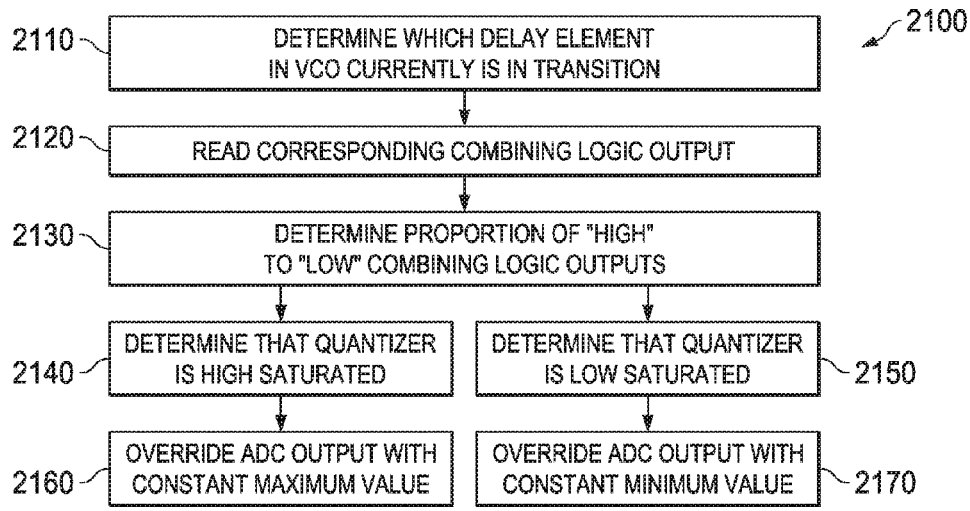
FIG. 21 is a flow chart showing an example method of generating predictable behavior in a ΔΣ ADC based on a dual-VCO integrator/quantizer.

In the example shown in FIG. 21, method 2100 can include determining 2110 which delay element of a plurality of delay elements in a first VCO in a VCO-based quantizer in an ADC currently is in transition, and then reading 2120 a combining logic output (e.g., an XOR output) corresponding to the delay element determined to be currently in transition. The determining 2210 and reading 2120 can be done, for example, using transition detector 34 as shown in FIGS. 2 and 6. Method 2100 can continue with determining 2130, with binary resolution, the proportion of combining logic outputs (e.g., outputs of gates in an array of XOR gates) in the ADC in a logical "high" state to such outputs in a logical "low" state. This determination 2130 can consist, for example, of setting a signal to a logical "high" if more than half the sub-units of combining logic (e.g., if more than half of the gates in the XOR array) read logical "high," and setting the signal to a logical "low" if half or fewer of the sub-units of combining logic (e.g., if half or fewer of the gates in the XOR array) read logical "high." The determination 2130 can be made, for example, using high-element counter 36 such as shown in FIGS. 2 and 6.

Method 2100 can continue with determining 2140 that the VCO-based quantizer in the ADC is in a state of high saturation or determining 2150 that the VCO-based quantizer in the ADC is in a state of low saturation, as those states are defined with reference to FIGS. 3, 5, 10-14, and the accompanying description provided above. The determinations 2140, 2150 can be made, for example, using saturation detector 38 as shown in FIGS. 2 and 6. Method 2100 can continue with overriding 2160 the ADC output with a constant maximum value based on the determination that the VCO-based quantizer is high saturated, or overriding 2170 the ADC output with a constant minimum value (e.g., zero signal) based on the determination that the VCO-based quantizer is low saturated. The overriding 2160, 2170 can be implemented, for example, using correction logic 58 as shown in FIGS. 6 and 14.

Methods 2000 and 2100 can also include not overriding ADC outputs, i.e., passing through quantized outputs as ADC outputs, based on determining that the quantizer is not saturated.

Figures 22, 23:
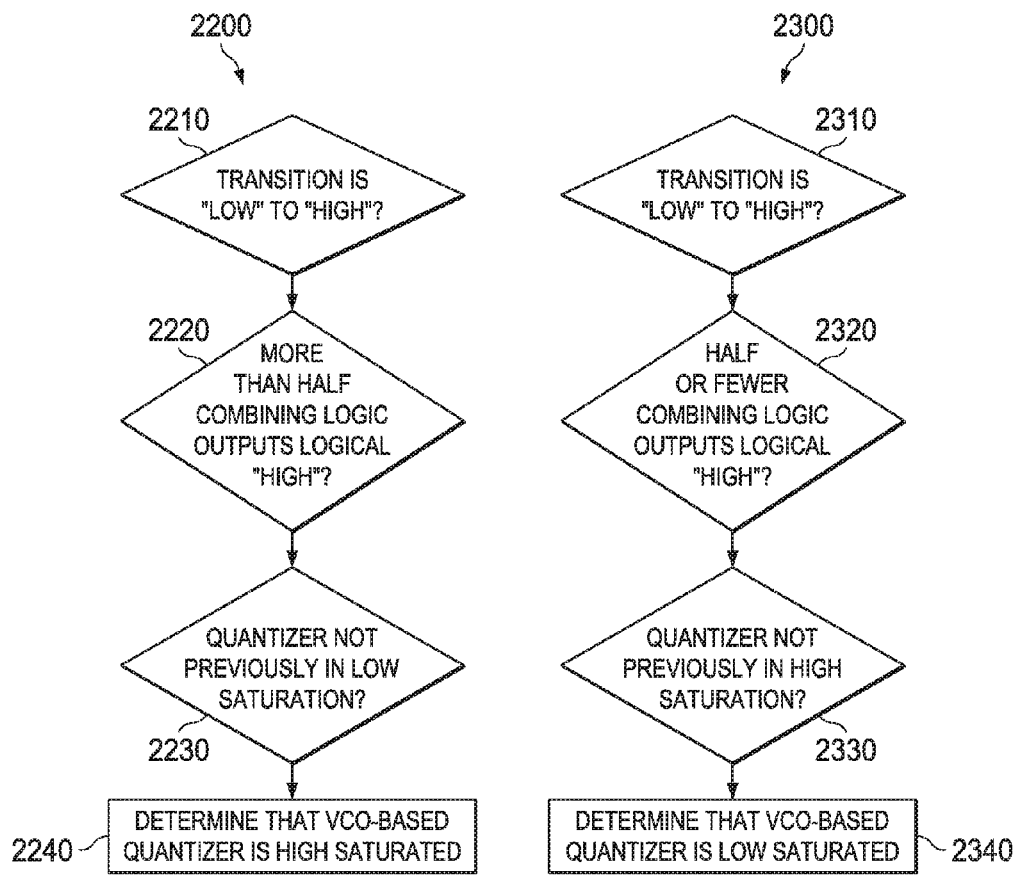
FIG. 22 is a flow chart showing an example method of determining that a dual-VCO quantizer is high saturated.
FIG. 23 is a flow chart showing an example method of determining that a dual-VCO quantizer is low saturated.

Another example method, shown in FIG. 22, is a method 2200 of determining that a VCO-based quantizer is high saturated. Method 2200 can begin by determining 2210 whether a detected transition in a ring of a VCO in the VCO-based quantizer has gone from a "high" logical state to a "low" logical state or, conversely, has gone from a "low" logical state to a "high" logical state. This determination 2210 can be referred to as a determination of transition direction. The determination 2210 can be accomplished, for example, using sequence detectors 74, 75 as shown in FIG. 7. Method 2200 can further include determining 2220 that more than half of outputs of combining logic (e.g., of XOR gates in an array of XOR gates) connected to the VCO-based quantizer are logical "high." This determination 2220 can be done, for example, using high-element counter 36 shown in FIGS. 2 and 6.

Method 2200 can further include determining 2230 that the quantizer was not immediately previously in a state of low saturation. This determination can be done, for example, using the logic shown in FIG. 7. The three determinations 2210, 2220, 2230 can be made in any order, or simultaneously, but should be made within the transition time of the quantizer, i.e., within the delay time τ of the delay elements in the VCO-based quantizer. When all three determinations are positively made, then it can be determined 2240 that the VCO-based quantizer is high saturated. This determination 2240 can be made using, for example, the saturation detector shown in FIGS. 2, 6, and 7.

Another example method, shown in FIG. 23, is a method 2300 of determining that a VCO-based quantizer is low saturated. Method 2300 can begin by determining 2310 whether a detected transition in a ring of a VCO in the VCO-based quantizer has gone from a "high" logical state to a "low" logical state or, conversely, has gone from a "low" logical state to a "high" logical state. This determination 2310 can be referred to as a determination of transition direction. The determination 2310 can be accomplished, for example, using sequence detectors 74, 75 as shown in FIG. 7. Method 2300 can further include determining 2320 that half or fewer of outputs of combining logic (e.g., of XOR gates in an array of XOR gates) connected to the VCO-based quantizer are logical "high." This determination 2320 can be implemented, for example, using high-element counter 36 shown in FIGS. 2 and 6.

Method 2300 can further include determining 2330 that the quantizer was not immediately previously in a state of high saturation. This determination can be done, for example, using the logic shown in FIG. 7. The three determinations 2310, 2320, 2330 can be made in any order, or simultaneously, but should be made within the transition time of the quantizer, i.e., within the delay time τ of the delay elements in the VCO-based quantizer. When all three determinations are positively made, then it can be determined 2340 that the VCO-based quantizer is low saturated. This determination 2340 can be made using, for example, the saturation detector shown in FIGS. 2, 6, and 7.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A voltage-controlled oscillator-based delta-sigma analog-to-digital converter (VCO-based ΔΣ ADC) comprising:
   a VCO-based quantizer comprising
      delay elements to provide VCO outputs based on an analog input signal; and
      combining logic to combine the VCO outputs so as to provide quantized outputs;
   detection logic to detect saturation of the VCO-based quantizer based on the quantized outputs and at least a portion of the VCO outputs; and
   correction logic to modify the quantized outputs and provide modified quantized outputs in response to the detection logic detecting the saturation of the VCO-based quantizer and to provide the quantized outputs unmodified in the absence of saturation being detected.

2. The converter of claim 1, wherein
   the VCO-based quantizer comprises a plurality of N-stage ring oscillators, each ring oscillator comprising a series of the delay elements, where N is a positive odd integer denoting the number of the delay elements,
   the input signal is a differential signal that provides a complimentary signal to each of the ring oscillators, and
   the detection logic is configured to detect the saturation of the VCO-based quantizer as VCO wrapping in the ring oscillators.

3. The converter of claim 2, wherein the detection logic comprises:
   a transition detector to determine which delay element in one of the ring oscillators is in transition and to provide an output from the combining logic corresponding to the determined delay element in transition;

a high-element counter to determine a proportion of outputs of the combining logic that are in transition; and a saturation detector to detect whether the VCO-based quantizer is in a high or low saturation state based on signals from the transition detector and the high-element counter.

4. The converter of claim 3, wherein the transition detector comprises, for each delay element in the one of the ring oscillators, an XNOR gate and an AND gate.

5. The converter of claim 3, wherein the saturation detector comprises saturation state detectors, the outputs of the saturation state detectors representing quantizer states of entering high saturation, leaving high saturation, entering low saturation, or leaving low saturation.

6. The converter of claim 3, wherein the saturation detector comprises sequence detector logic that, based on the output of the transition detector, provides outputs representing whether the transition detector has detected a "low-high" transition sequence or a "high-low" transition sequence.

7. The converter of claim 1, wherein the correction logic comprises, for each of the quantized outputs, an inverter, an AND gate, and an OR gate.

8. The converter of claim 1, further comprising a feedback loop connected between outputs of the correction logic and an input to the converter, the feedback loop including a multi-bit digital-to-analog converter (DAC), the feedback loop to provide from the correction logic outputs to the DAC one of the unmodified or modified quantized outputs depending on whether the saturation of the VCO-based quantizer is detected.

9. The converter of claim 8, wherein the feedback loop has a loop gain, the converter further comprising a differential integrator within the feedback loop to achieve a second-order integration.

10. The converter of claim 1, wherein the converter has an order higher than one.

11. An integrated circuit chip comprising the converter of claim 1, fabricated on a substrate within an area no greater than 0.06 mm$^2$.

12. A method of converting an analog signal to a corresponding digital signal, the method comprising:

detecting, based on quantized outputs and at least a portion of VCO outputs of a VCO-based quantizer, VCO wrapping in the VCO-based quantizer, the quantized outputs being generated by combining the VCO outputs;

modifying the quantized outputs to enforce a constant minimum or maximum output in response to detecting the saturation of the VCO-based quantizer.

13. The method of claim 12, wherein the VCO-based quantizer comprises a first VCO and a second VCO, each comprising a plurality of delay elements;

wherein the combining, for each of pair of the VCO outputs, further comprises combining an output of a given delay element in the first VCO and an output of an associated delay element in the second VCO to provide a corresponding one of the quantized outputs; and wherein the detecting VCO wrapping comprises:

determining which delay element of the plurality of delay elements in the first VCO currently is in transition; and reading the quantized output corresponding to the determined delay element that is currently in transition.

14. The method of claim 13, wherein the detecting VCO wrapping further comprises:

determining a proportion of logical "high" combining logic outputs to logical "low" combining logic outputs.

15. The method of claim 14, wherein the detecting VCO wrapping further comprises:

determining, based on the read combining logic output corresponding to the determined currently transitioning delay element and on the determined proportion of combining logic outputs, that the VCO-based quantizer is high saturated; or determining, based on the read combining logic output corresponding to the determined currently transitioning delay element and on the determined proportion of combining logic outputs, that the VCO-based quantizer is low saturated.

16. The method of claim 15, wherein the modifying comprises:

modifying the quantized outputs to enforce a constant maximum output based on the determining that the VCO-based quantizer is high saturated; or modifying the quantized outputs to enforce a constant minimum output based on the determining that the VCO-based quantizer is low saturated.

17. An analog-to-digital converter (ADC) comprising:

a quantizer comprising at least two ring oscillators arranged in a pseudo-differential manner, each ring oscillator comprising a plurality of delay elements, the quantizer having high and low saturation states characterized by phase differences between each of the ring oscillators;

an array of XOR gates, each XOR gate in the array to provide an output based on inputs from a corresponding delay element in each ring oscillator;

a feedback loop that includes a digital-to-analog converter (DAC); and saturation correction logic arranged between the XOR gates and the DAC to enforce a constant maximum output signal or a constant minimum output signal for high and low saturation states, respectively, in response to detecting VCO wrapping between the at least two ring oscillators in the quantizer.

18. The converter of claim 17, wherein the converter does not include components for dynamic element matching (DEM) of DAC elements.

19. The converter of claim 17, further comprising detection logic to detect the VCO wrapping, the detection logic comprising:

a transition detector to determine which delay element in one of the at least two ring oscillators is in transition and to provide an output from the array of XOR gates corresponding to the determined delay element in transition;

a high-element counter to determine a proportion of outputs of the combining logic that are in transition; and a saturation detector to detect whether the VCO-based quantizer is in a high or low saturation state based on signals from the transition detector and the high-element counter.

20. The converter of claim 17, further comprising a differential integrator in the feedback loop to provide second-order or higher-order noise shaping.

* * * * *